United States Patent
Cho

(10) Patent No.: US 6,940,776 B2
(45) Date of Patent: Sep. 6, 2005

(54) SEMICONDUCTOR MEMORY DEVICE CAPABLE OF READING DATA OF SIGNATURE FUSE THROUGH NORMAL READ OPERATION AND METHOD OF READING DATA OF SIGNATURE FUSE IN SEMICONDUCTOR MEMORY DEVICE THROUGH NORMAL READ OPERATION

(75) Inventor: Sung-bum Cho, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/760,955

(22) Filed: Jan. 20, 2004

(65) Prior Publication Data

US 2004/0151048 A1 Aug. 5, 2004

(30) Foreign Application Priority Data

Jan. 30, 2003 (KR) ................... 10-2003-0006366

(51) Int. Cl.[7] ................................ G11C 7/00
(52) U.S. Cl. ................ 365/225.7; 365/189.05; 365/201
(58) Field of Search .............. 365/225.7, 201, 365/189.04, 189.08, 189.05, 233

(56) References Cited

U.S. PATENT DOCUMENTS 4,480,199 A    10/1984  Varshney et al. ........... 307/303
5,818,285 A  * 10/1998  Lee et al.
6,262,919 B1 *  7/2001  Chou
6,483,373 B1 * 11/2002  Lim et al.

* cited by examiner

Primary Examiner—Son T. Dinh
Assistant Examiner—Hien Nguyen
(74) Attorney, Agent, or Firm—Mills & Onello LLP

(57) ABSTRACT

In a semiconductor memory device capable of reading data regarding signature fuses through a normal read operation and a method of reading data regarding signature fuses in a semiconductor memory device through the normal read operation, a semiconductor memory device includes a memory cell array with a plurality of memory cells, an input buffer, and an output buffer. The input buffer writes signature fuse data related to signature fuses to the memory cells respectively when the semiconductor memory device enters a test mode. The output buffer reads the signature fuse data from the memory cells during a normal read operation of the semiconductor memory device. The signature fuse data comprises binary data that is determined based on whether the respective signature fuses are cut. Accordingly, the semiconductor memory device does not require connection of the output buffer to test-related circuits for outputting the signature fuse data while operating in a test mode. As a result, loads on the output buffer do not increase, and therefore, the speed of reading data from the output buffer is not adversely impacted during a normal read operation.

12 Claims, 9 Drawing Sheets

SEMICONDUCTOR MEMORY DEVICE CAPABLE OF READING DATA OF SIGNATURE FUSE THROUGH NORMAL READ OPERATION AND METHOD OF READING DATA OF SIGNATURE FUSE IN SEMICONDUCTOR MEMORY DEVICE THROUGH NORMAL READ OPERATION

RELATED APPLICATIONS

This application claims the priority of Korean Patent Application No. 2003-6366, filed on Jan. 30, 2003, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to a semiconductor memory device capable of reading data regarding signature fuses through a normal read operation and a method of reading data regarding signature fuses in the semiconductor device through the normal read operation.

2. Description of the Related Art

The fabrication history of a semiconductor memory device can include useful information about the device and generally includes information regarding the mask, a fuse, wafer fabrication, package assembly, test results, and so on. Sometimes, critical fabrication history information is lost during manufacturing when the semiconductor memory device undergoes a wafer fabrication process, a package assembly process, and a module assembly process. Therefore, to prevent the loss of information, critical fabrication history is recorded within the semiconductor memory device.

Writing of the fabrication history can be performed on fuses included in the semiconductor memory device using a cutting process or a non-cutting process. Here, the fuses may be signature fuses that store data that specifies, for example, lot identification, the position of a die on a wafer, trimming fuses used to control AC timing and DC voltage/current, and redundancy fuses used to repair failed memory cells of the semiconductor memory device.

The fabrication history may be read from the semiconductor memory device using one of the following methods: (1) decapping semiconductor chips which are assembled together through a packaging process, and determining a pattern of cut/not cut signature fuses with the naked eye; (2) measuring currents flowing through an input pin, such as an address pin, which is coupled to a circuit via the signature fuses and reading data from the signature fuses in an analog manner; and (3) reading data from signature fuses in a test mode in a digital manner. A circuit with signature fuses from which data is read in the analog manner described in method (2) above is disclosed in U.S. Pat. No. 4,480,199.

FIG. 1 is a schematic block diagram illustrating the structure of a conventional semiconductor memory device 100 that is capable of reading data regarding the signature fuses in a test mode in a digital manner. Referring to FIG. 1, the semiconductor memory device 100 includes a fuse box selection circuit 110, a plurality of fuse boxes 121, 122, . . . , 12n, an output pipeline 130, an output control circuit 140, an output buffer 150, and a data input/output (I/O) pin DQ 160.

The semiconductor memory device 100 is, for example, an apparatus that satisfies the RLC specifications of a Rambus DRAM that can operate above a predetermined frequency, i.e., a high frequency, or satisfies the Input/output buffer information specifications of a synchronous DRAM that can operate at a high frequency.

The fuse box selection circuit 110 generates selection signals SELi (i is an integer from 1 to n) for respectively selecting the fuse boxes 121, 122, . . . , 12n, in response to a command signal CMD that is in phase with a clock signal CLK and a combination of address signals ADDR. The command signal CMD and the combination of the address signals ADDR may enable the semiconductor memory device 100 to enter a direct access (DA) mode and a signature fuse read mode, which are test modes, or to exit the signature fuse read mode. The signature fuse read mode is an operation mode where data is output from the signature fuses.

Each of the fuse boxes 121, 122, . . . , 12n includes a plurality of signature fuses and stores bit data regarding signature fuses, the data being at a logic high level (a level "1") or a logic low level (a level "0") depending on whether the signature fuses are cut or not. The fuse boxes 121, 122, . . . , 12n respectively output the stored bit data in response to the selection signals SELi. The output data may specify, for example, fabrication history information, related to the position of a semiconductor chip or a die on a wafer, a lot number, and a wafer number.

The output control circuit 140 generates a control signal for controlling the output pipeline 130 in response to the command signal CMD synchronized with the clock signal CLK. The command signal CMD may instruct the semiconductor memory device 100 to enter the signature fuse read mode.

The output pipeline 130 converts parallel data regarding the signature fuses, which is input from the fuse boxes 121, 121, . . . , 12n, respectively, into serial data SIG_D in response to the control signal generated by the output control circuit 140. Next, the output pipeline 130 sequentially outputs the serial data to be in phase with the clock signal CLK.

The output buffer 150 selects one of the serial data SIG_D output from the output pipeline 130 and output data DOUT generated during a normal read operation, in response to a command signal CMD that is in phase with the clock signal CLK and a combination of address signals ADDR. Then, the output buffer 150 sends the selected data to the data IO pin DQ 160. The command signal CMD and the combination of the address signals ADDR may enable the semiconductor memory device 100 to enter the signature fuse read mode that is a test mode, or to perform the normal read operation. During the normal read operation, the data DOUT is read from memory cells (not shown) of the semiconductor memory device 100.

FIGS. 2A and 2B are illustrative timing diagrams of a read operation involving the reading of signature fuse data for the semiconductor memory device 100 of FIG. 1. More specifically, the timing diagrams shown in FIGS. 2A and 2B refer to a read operation for reading data regarding the signature fuses in a Rambus DRAM.

Referring to FIGS. 2A and 2B, the read operation is performed in the following sequence of steps: direct access mode setting, signature fuse read mode setting, register framing, request packet inputting, address packet inputting, dummy packet outputting, and signature fuse data reading.

During the direct access mode setting, a direct access (DA) mode, which is a test mode, is set in response to a command signal CMD, which is in phase with a clock signal SCK, and a combination of address signals ADDR input from a serial I/O pin SIOφ. Then, a direct access mode signal DAmode that indicates activation or inactivation of the DA mode, is activated to a high level.

During the signature fuse read mode setting, the signature fuse read mode which is a test mode, is set in response to a command signal CMD which is in phase with a clock signal SCK and a combination of the address signals ADDR input from the serial I/O pin SIOφ. Then, a signature fuse read mode signal SIG_RD that indicates activation or inactivation of the signature fuse read mode, is activated to a high level.

During register framing, a starting point of an input packet is determined. Next, during the request packet inputting step, a request packet is input via the serial I/O pin SIOφ, the request packet instructing a read operation of a control register in the Rambus DRAM. Next, during the address packet inputting section, an address packet, which is used to select one of the fuse boxes 121, 122, . . . , 12n of FIG. 1, is input via the serial I/O pin SIOφ. Thereafter, during the dummy packet outputting and the signature fuse data reading sections, a dummy packet is output via the serial I/O pin SIOφ, and then, signature fuse data SIG_D is read. FIG. 2B illustrates outputting of 16-bit signature fuse data F1, . . . , F16 in synchronization with the clock signal SCK.

However, since the conventional semiconductor memory device 100 reads the signature fuse data directly through a data read path, circuits, such as the fuse box selection circuit 110, the fuse boxes 121, . . . , 12n, the output control circuit 140, and the output pipeline 130, which output the signature fuse data are connected to the output buffer 150, thereby increasing the load placed on the output buffer 150. In view of the increased load on the output buffer due to the signature fuse test circuitry, the read speed of the output data DOUT output via the output buffer 150 may become slow during a normal read operation.

SUMMARY OF THE INVENTION

The present invention provides a semiconductor memory device capable of preventing the reduction of the speed for reading output data during a normal read operation by writing the data regarding signature fuses stored in the semiconductor memory device to memory cells while operating in a test mode, and then reading the signature fuse data from the memory cells during a normal read operation. A method of reading the signature fuse data from the semiconductor memory device through a normal read operation is also provided.

A semiconductor memory device according to the present invention, which is capable of reading the signature fuse data through the normal read operation, includes a memory cell array including a plurality of memory cells.

According to an aspect of the present invention, there is provided a semiconductor memory device including a plurality of memory cells, the semiconductor memory device comprising: an input buffer that respectively writes signature fuse data related to the status of signature fuses to the memory cells when the semiconductor memory device enters a test mode; and an output buffer that reads the signature fuse data from the memory cells during a normal read operation of the semiconductor memory device, wherein the signature fuse data comprises binary data that is determined based on whether the respective signature fuses are cut.

In one embodiment, the input buffer writes one of the signature fuse data and input data, which is generated during a normal write operation of the semiconductor memory device, to the respective memory cells in response to a command signal which is synchronized with a clock signal and a combination of address signals. The input data is initialization data at a low level "0" that is written to the memory cells prior to writing of the signature fuse data to the respective memory cells.

In another embodiment, the semiconductor memory device further comprises a fuse box selection circuit that decodes the command signal which is synchronized with the clock signal and the combination of the address signals and generates a plurality of selection signals; and a plurality of fuse boxes including the signature fuses that output the signature fuse data in response to the selection signals, respectively.

In another embodiment, the address signal for selecting the respective fuse boxes is the same as the address signal for selecting the respective memory cells to which the signature fuse data is written.

In another embodiment, the command signal that is in phase with the clock signal and a combination of the address signals enable the semiconductor memory device to enter or exit a signature fuse read mode.

In another embodiment, the address signal is one of an externally generated address signal and an internal address signal generated in an internal address generator of the semiconductor memory device.

According to another aspect of the present invention, there is provided a method of reading data regarding signature fuses in a semiconductor memory device, the method comprising (a) entering a signature fuse read mode in response to a command signal that is in phase with the clock signal and a combination of address signals; (b) outputting signature fuse data related to signature fuses included in fuse boxes selected in response to the address signal; (c) writing the output signature fuse data to memory cells selected in response to the address signal that is the same as the address signal used in step (b); (d) exiting the signature fuse read mode in response to a command signal that is in phase with a clock signal and the combination of address signals; and (e) reading the signature fuse data from the memory cells through a normal read operation of the semiconductor memory device.

In one embodiment, (a) includes initializing the memory cells by writing data at a low level "0" to the memory cells through a normal write operation.

In another embodiment, (c) further comprises determining whether data related to a signature fuse to be written to a corresponding memory cell concerns a last signature fuse, and continuing to write data regarding the signature fuses to the corresponding memory cells until the signature fuse data of the last signature fuse is written to the memory cells.

According to yet another aspect of the present invention, there is provided a method of reading data regarding signature fuses in a semiconductor memory device, the method comprising (a) entering a signature fuse read mode in response to a command signal that is in phase with a clock signal and a combination of internal address signals; (b) outputting signature fuse data regarding signature related to signature fuses that are included in respective fuse boxes selected in response to the internal address signal; (c) writing the output signature fuse data to memory cells selected in response to the internal address signal that is the same as the internal address signal used in (b); (d) exiting the signature fuse read mode in response to a command signal that is in phase with a clock signal and a combination of address signals; and (e) reading the written signature fuse data from the memory cells through a normal read operation of the semiconductor memory device.

In one embodiment, (a) further comprises initializing the memory cells by writing data at a low level "0" to the memory cells through the normal write operation.

In a semiconductor memory device capable of reading signature fuse data through a normal read operation and a method of reading data regarding signature fuses in the semiconductor memory device through the normal read operation, according to the present invention, the signature fuse data is written to memory cells of the semiconductor memory device in a test mode and is read through the normal read operation. Accordingly, in the test mode, there is no need for connecting test-related circuits for outputting data of the signature fuses to the output buffer from which the signature fuse data is output, thereby preventing an increase in the load applied to the output buffer. In this manner, the speed for reading the signature fuse data from the output buffer is not adversely affected by the signature fuse test circuitry during a normal read operation.

BRIEF DESCRIPTION OF THE DRAWINGS

The above and other aspects and advantages of the present invention will become more apparent by describing in detail preferred embodiments thereof with reference to the attached drawings in which.

DETAILED DESCRIPTION OF PREFERRED EMBODIMENTS

Figure 1:
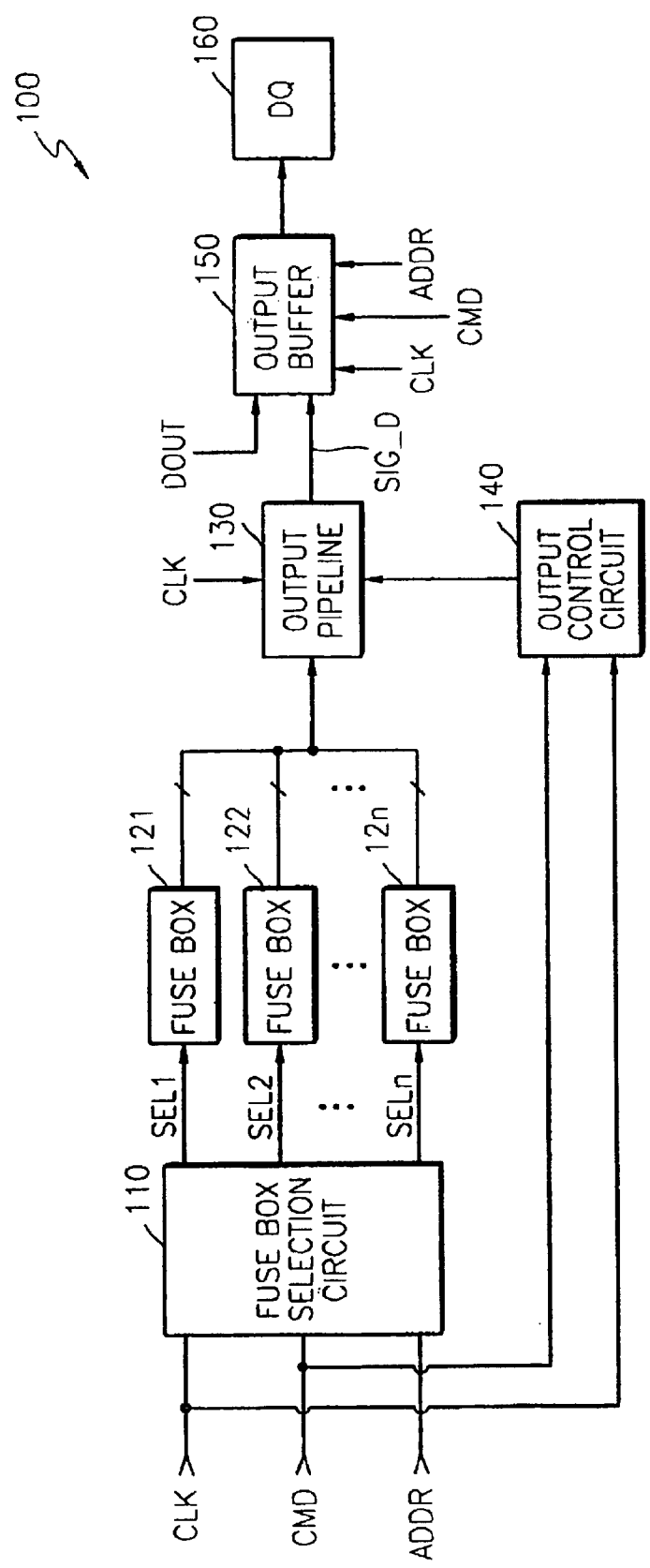
FIG. 1 is a schematic block diagram illustrating the structure of a conventional semiconductor memory device capable of reading data regarding signature fuses in a digital manner in a test mode.
Figure 2A:
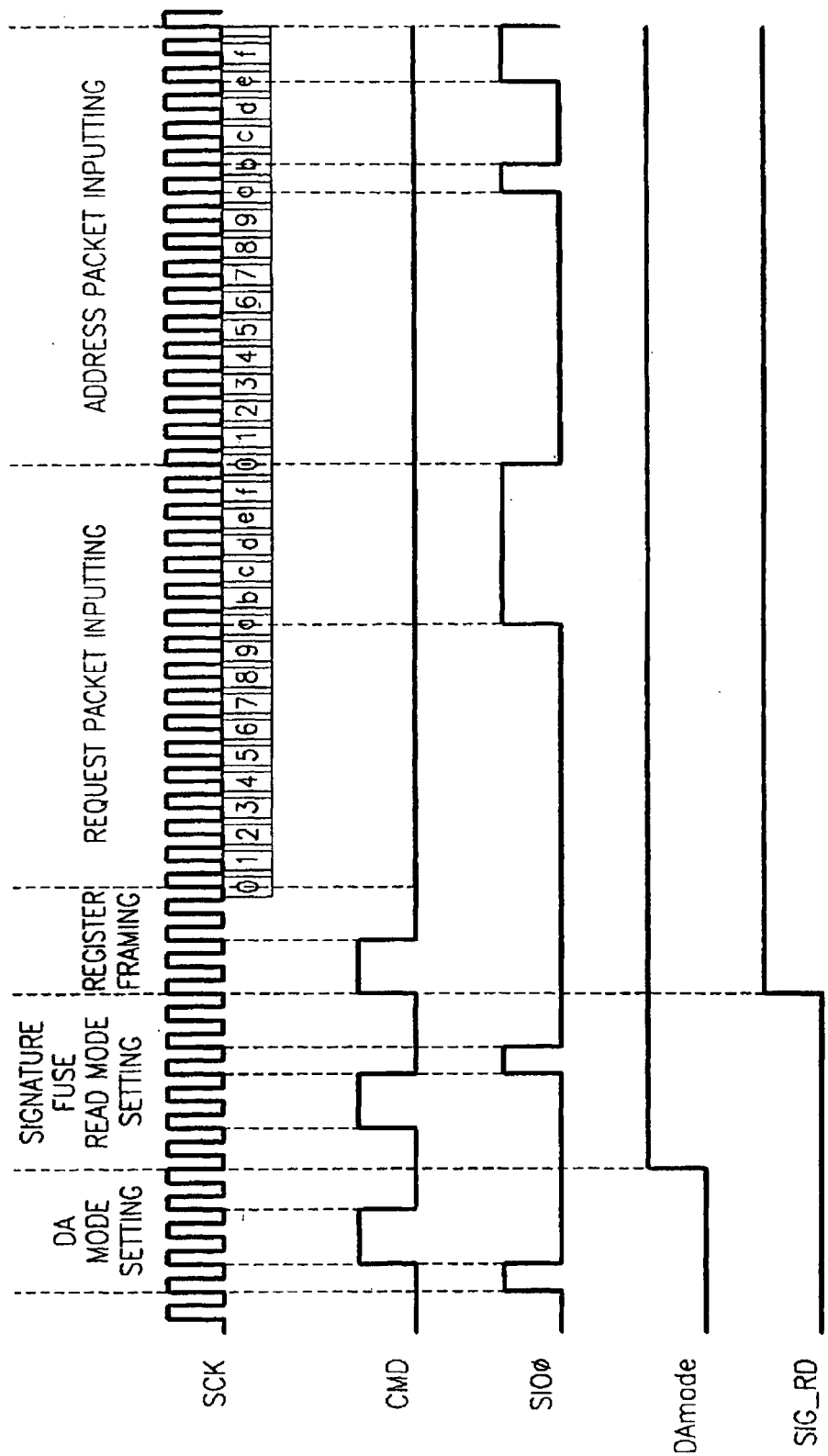
FIGS. 2A and 2B are timing diagrams of a read operation of reading data regarding signature fuses in the semiconductor memory device of FIG. 1.
Figure 2B:
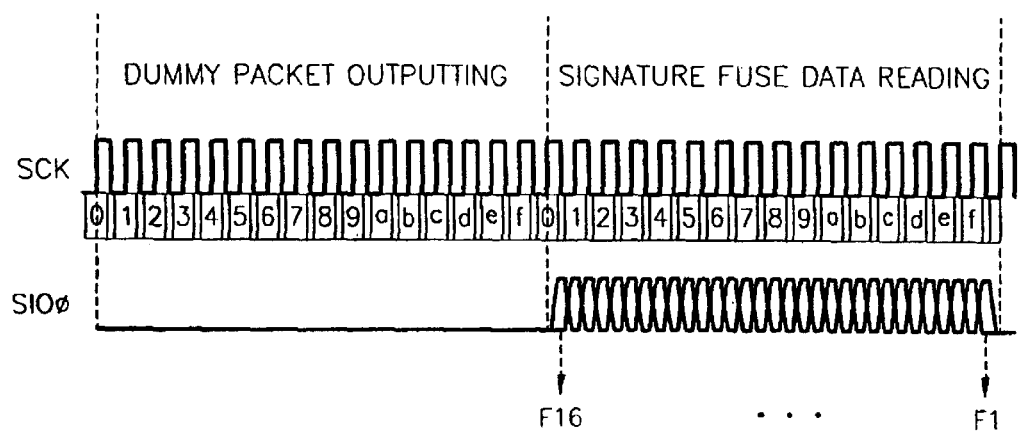

Hereinafter, preferred embodiments of the present invention will be described in detail with reference the accompanying drawings. The same reference numerals represent the same elements throughout the drawings.

Figure 3:
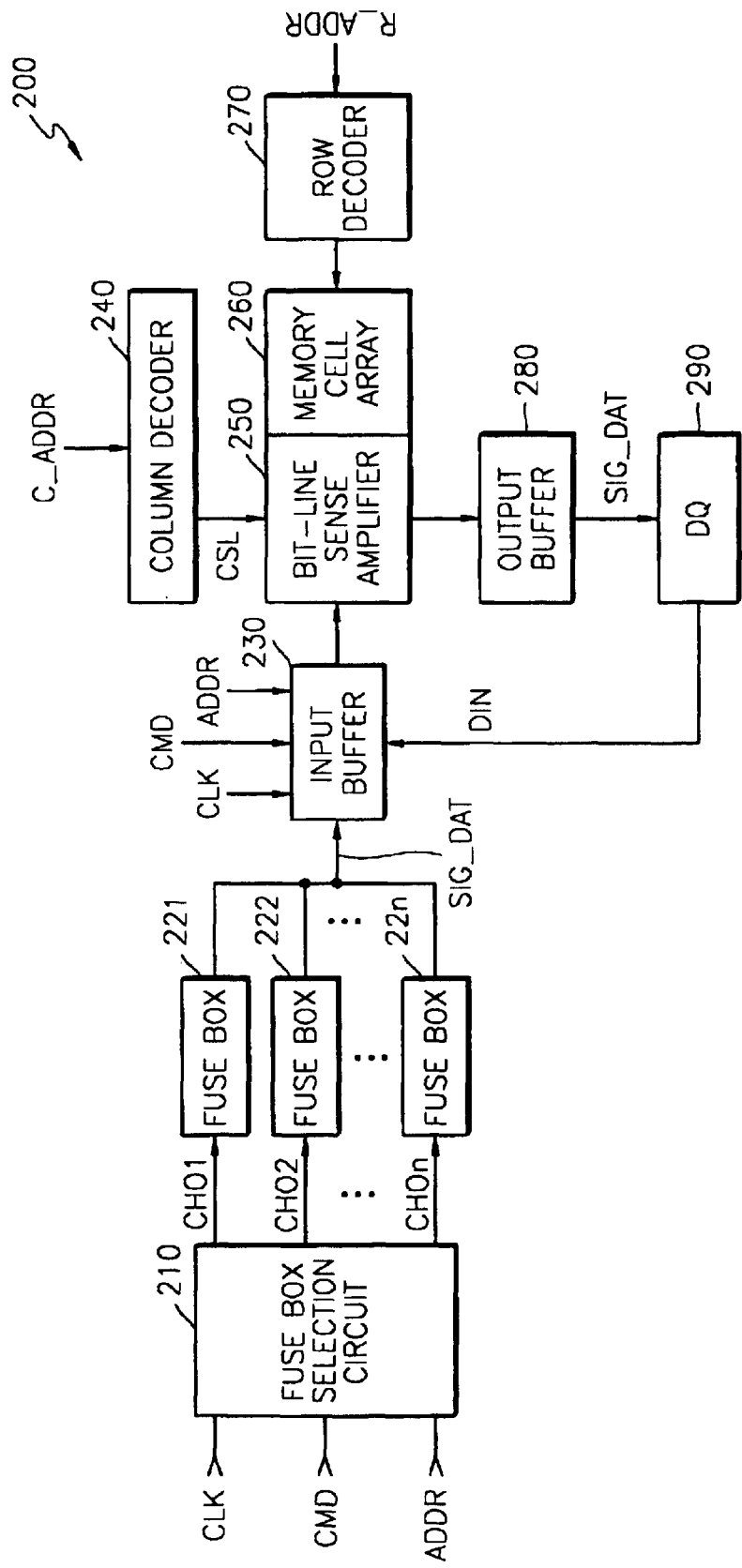
FIG. 3 is a block diagram illustrating the structure of a semiconductor memory device that reads data regarding signature fuses through a normal read operation, according to a preferred embodiment of the present invention.

FIG. 3 is a block diagram illustrating the structure of a semiconductor memory device 200 capable of reading data stored in signature fuses through a normal read operation, according to a preferred embodiment of the present invention. Referring to FIG. 3, the semiconductor memory device 200 includes a fuse box selection circuit 210, a plurality of fuse boxes 221, 222, . . . , 22n, an input buffer 230; a column decoder 240, a bit-line sense amplifier 250, a memory cell array 260, a row decoder 270, an output buffer 280, and a data input/output (I/O) pin DQ 290.

The fuse box selection circuit 210 generates selection signals CHOi (i is an integer from 1 to n) for selecting the respective fuse boxes 221, 222, . . . , 22n, in response to a command signal CMD that is in phase with a clock signal CLK and a combination of address signals ADDR. The command signal CMD and the combination of the address signals ADDR may enable the semiconductor memory device 200 to enter a direct access (DA) mode and a signature fuse read mode, which are test modes, or to end the signature fuse read mode. The signature fuse read mode is an operation mode where data SIG_DAT from the signature fuses is output. The semiconductor memory device 200 may directly enter the signature fuse read mode without entering the DA mode.

Each of the fuse boxes 221, 222, . . . , 22n includes signature fuses and stores several-bit data regarding the signature fuses, the data being at a logic high level (level "1") or a logic low level (level "0") depending on whether the signature fuses are cut or not. The respective fuse boxes 221, 222, . . . , 22n output data SIG_DAT as the stored data in response to the selection signals CHOi. The output data SIG_DAT may, for example, contain historical information related to the manufacture of the device, including for example, specifying the position of a semiconductor chip or a die on a wafer, a lot number, and a wafer number.

The input buffer 230 selects one of the data SIG_DAT output from the respective fuse boxes 221, 222, . . . , 22n and input data DIN generated during a normal write operation, and sends the selected data to the bit-line sense amplifier 250, in response to a command signal CMD that is in phase with a clock signal CLK and a combination of address signals ADDR. The command signal CMD and the combination of the address signals ADDR enable the semiconductor memory device 200 to enter a signature fuse read mode that is a test mode or to perform a normal write operation. During the normal write operation, the input data DIN is written to memory cells of the memory cell array 260.

The memory cell array 260 includes a plurality of memory cells. The row decoder 270 decodes a row address signal R_ADDR among the address signals ADDR which are used to select the signature fuses from the fuse boxes 221, 222, . . . , 22n, and selects the memory cells connected with one another via a word line (not shown). The column decoder 240 decodes a column address signal C_ADDR among the address signals ADDR which are used to select the signature fuses from the fuse boxes 221, 222, . . . , 22n, and generates a column selection line activation signal CSL. Here, the column selection line activation signal CSL activates column selection lines (not shown) connected with one another through the bit-line sense amplifier 250 that amplifies bit lines (not shown) connected to the respective memory cells. Address signals used in the fuse box selection circuit 210, the input buffer 230, the column decoder 240, and the row decoder 270 are applied from a source external to the semiconductor memory device 200.

A method of writing the signature fuse data SIG_DAT to the memory cells of the memory cell array 260 and reading it back from the memory cells will now be described. First, during the normal write operation, the input data DIN at a level "0" is input at the data I/O pin DQ 290, sequentially passes through the input buffer 230, and the bit-line sense amplifier 250, and is finally written to the memory cells of the memory cell array 260. Next, when the semiconductor memory device 200 enters the signature fuse read mode that is a test mode, the signature fuse data SIG_DAT output from the respective fuse boxes 221, 222, ..., 22n passes through the input buffer 230 and the bit-line sense amplifier 250, and is then written to the memory cells of the memory cell array 260. Next, when the signature fuse read mode ends, the normal read operation begins and the signature fuse data SIG_DAT written to the memory cells of the memory cell array 260 is read and output to the data I/O pin DQ 290 via the output buffer 280.

Accordingly, the semiconductor memory device 200 according to a preferred embodiment of the present invention does not require connection of the output buffer 280 to test-data related circuits, such as the fuse box selection circuit 210 and the fuse boxes 221, 222, ..., 22n, which output the signature fuse data SIG_DAT. Thus, the load applied to the output buffer 280 does not increase, and thus, the speed of reading data from the output buffer 280 does not decrease during the normal read operation.

Figure 4:
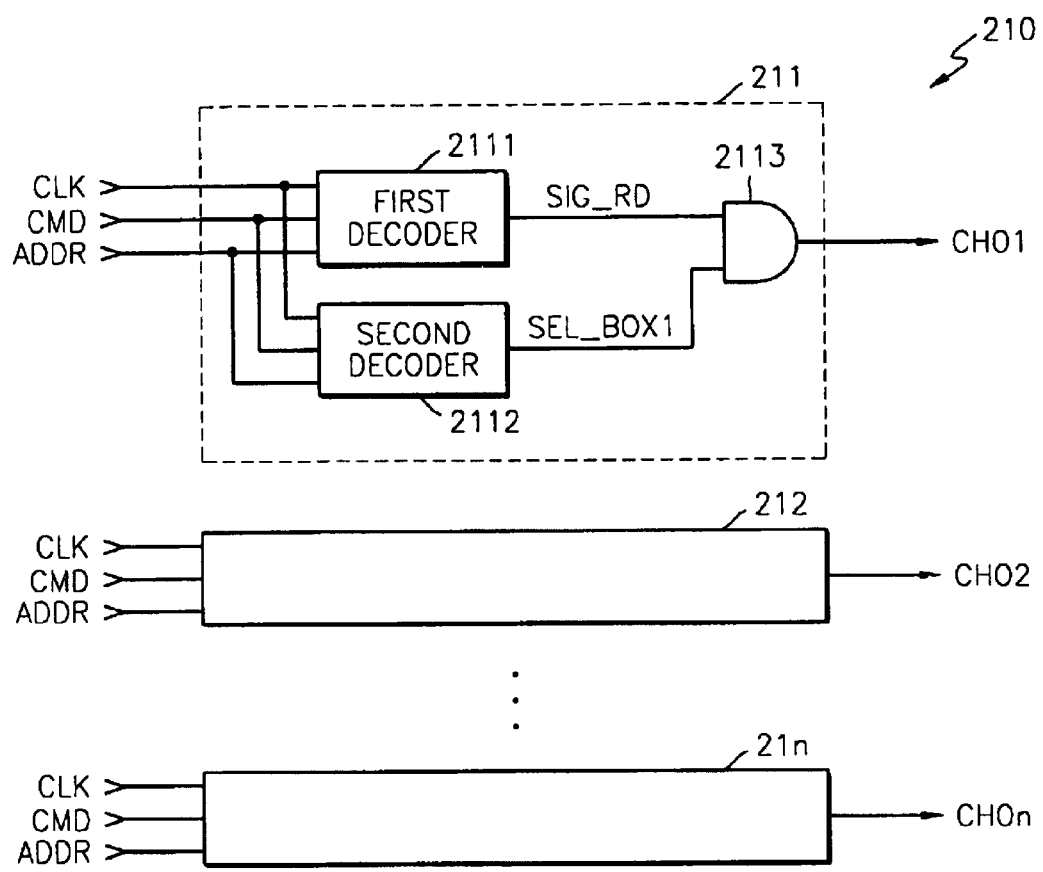
FIG. 4 is a detailed block diagram illustrating the structure of the fuse box selection circuit shown in FIG. 3.

FIG. 4 is a detailed block diagram illustrating the structure of the fuse box selection circuit 210 shown in FIG. 3. Referring to FIG. 4, the fuse box selection circuit 210 includes a plurality of unit selection circuits 211, 212, ... 21n.

The first unit selection circuit 211 includes a first decoder 2111, a second decoder 2112, and an AND circuit 2113. The first decoder 2111 decodes a command signal CMD which is in phase with a clock signal CLK and a combination of address signals ADDR, and generates a signature fuse read mode signal SIG_RD that indicates activation or inactivation of the signature read mode. Although not shown in FIG. 4, the signal that indicates the activation or inactivation of the DA mode and can be set prior to entering the signature read mode may also be generated by a decoder in a similar manner. The second decoder 2112 decodes a command signal CMD which is in phase with a clock signal CLK and a combination of address signals ADDR, and generates a first fuse box selection signal SEL_BOX1. The AND circuit 2113 performs an AND operation on the signature fuse read mode signal SIG_RD and the first fuse box selection signal SEL_BOX1 to produce a selection signal CHO1 for selecting the fuse box 221 of FIG. 3.

The structures of the unit selection circuits 212 through 21n are the same as that of the first unit selection circuit 211 and their descriptions will not be described here. As in the first unit selection circuit 211, fuse box selection signals SEL_BOX2 through SEL_BOXn are generated by decoders of the unit selection circuits 212 through 21n, the decoders corresponding to the second decoder 2112, and selection signals CHO2 through CHOn are generated by the fuse box selection circuits 212 through 21n, respectively. The selection signals CHO2 through CHOn are used to select the fuse boxes 222 through 22n, respectively.

Figure 5:
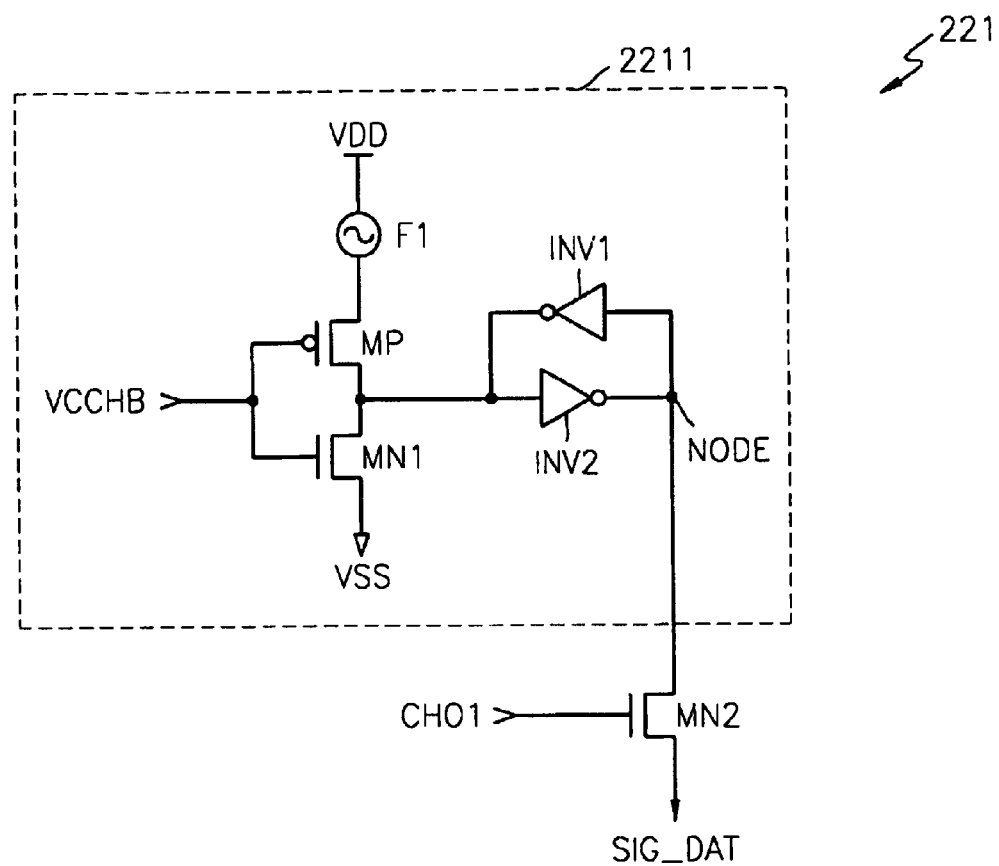
FIG. 5 is a detailed circuit diagram illustrating one of the fuse boxes shown in FIG. 3.

FIG. 5 is a detailed circuit diagram illustrating the structure of the fuse box 221 of FIG. 3. Referring to FIG. 5, the fuse box 221 includes a fuse circuit 2211 and an NMOS transistor MN2. The fuse circuit 2211 includes a signature fuse F1, a PMOS transistor MP, an NMOS transistor MN1, and inverters INV1 and INV2 that constitute a latch circuit. A power supply voltage VDD is applied to an end of the signature fuse F1 and a ground voltage VSS is applied to a source of the NMOS transistor MN1.

The fuse circuit 2211 stores data, which reaches a level "1" or a level "0" depending on whether the signature fuse F1 is cut or not, in an output node NODE of the inverters INV1 and INV2, in response to a pulse signal VCCHB. The pulse signal VCCHB is activated to a high level for a predetermined time when the power supply voltage VDD is supplied to the semiconductor memory device 200. In detail, if the signature fuse F1 is not cut, a data signal at the level "0" is stored in the output node NODE in response to the pulse signal VCCHB. If the signature fuse F1 is cut, a data at signal at the level "1" is stored in the output node NODE in response to the pulse signal VCCHB.

The NMOS transistor MN2 outputs signature fuse data SIG_DAT stored in the output node NODE of the fuse circuit 2211 in response to a selection signal CHO1.

The structures of the fuse boxes 222 through 22n are the same as that of the fuse box 221 and their descriptions will be omitted. FIG. 5 illustrates a fuse box 221 capable of storing 1-bit data, but the fuse box 221 may include a plurality of fuse circuits that store several-bit data.

Figure 6:
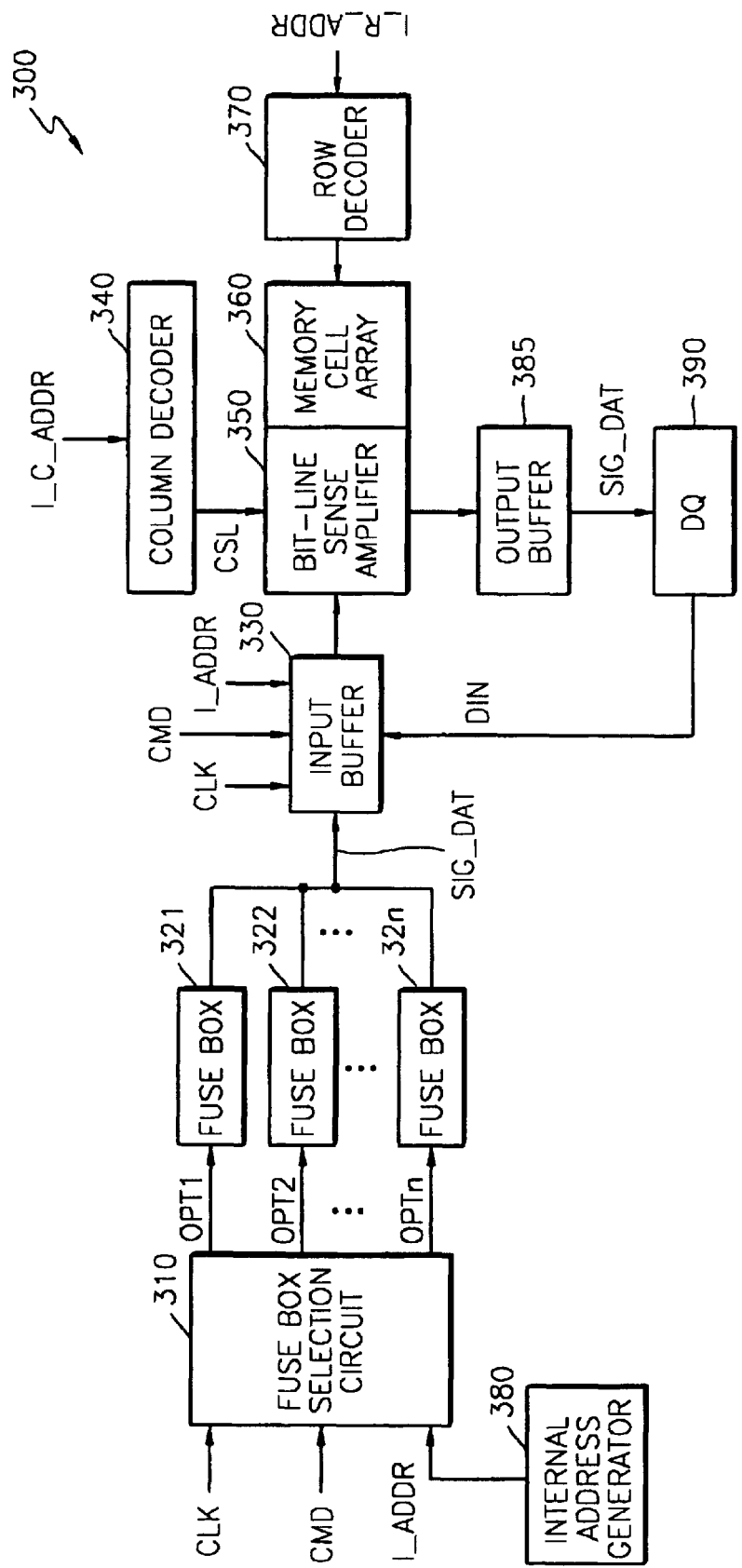
FIG. 6 is a block diagram illustrating the structure of a semiconductor memory device that reads data regarding signature fuses through a normal read operation, according to another embodiment of the present invention.

FIG. 6 is a block diagram illustrating the structure of a semiconductor memory device 300 that is capable of reading data regarding signature fuses through the normal read operation, according to another embodiment of the present invention. Referring to FIG. 6, the semiconductor memory device 300 includes a fuse box selection circuit 310, a plurality of fuse boxes 321, 322, ..., 32n, an input buffer 330, a column decoder 340, a bit-line sense amplifier 350, a memory cell array 360, a row decoder 370, an internal address generator 380, an output buffer 385, and data I/O pin DQ 390.

As compared to the semiconductor memory device 200 according to a preferred embodiment of the present invention, the semiconductor memory device 300 according to another embodiment further includes the internal address generator 380. For this reason, an address signal used in the semiconductor memory device 300 is an internal address signal I_ADDR generated in the internal address generator 380. In contrast, the address signal used in the semiconductor memory device 200 is an external address signal applied from an external source. The internal address signal generator 380 automatically generates a first address through a last address for selecting the fuse boxes 321, 322, ..., 32n, respectively, and may include a counter for this purpose.

The fuse box selection circuit 310 generates a selection signal OPTi (i is an integer from 1 through n) for selecting the fuse boxes 321, 322, ..., 32n, respectively, in response to a command signal CMD which is in phase with a clock signal CLK and a combination of the internal address signals I_ADDR. The command signal CMD and the combination of the internal address signals I_ADDR may enable the semiconductor memory device 300 to enter the DA mode and a signature fuse read mode which are test modes or to end the signature fuse read mode. Meanwhile, the semiconductor memory device 300 may alternatively directly enter the signature fuse read mode without entering the DA mode. The structure of the fuse box selection circuit 310 is the same as that of the fuse box selection circuit 210 shown in FIG. 4.

Each of the fuse boxes 321, 322, ..., 32n includes a signature fuse and stores data that reaches a level "1" or a level "0" depending on whether the signature fuse is cut or not. The respective fuse boxes 321, 322, ..., 32n output the stored data as data SIG_DAT regarding the signature fuses in response to a selection signal OPTi. The data SIG_DAT may specify the position of a semiconductor chip or a die on a wafer, a lot number, and a wafer number. The fuse boxes 321, 322, ..., 32n have the same constructions as the fuse box 221 of FIG. 5.

The input buffer 330 selects one of the signature fuse data SIG_DAT, which is output from the fuse boxes 321, 322, ..., 32n, respectively, and input data DIN generated during the normal write operation, in response to a command signal CMD which is in phase with a clock signal CLK and a combination of internal address signals I_ADDR. The selected data is transmitted to the bit-line sense amplifier 350. The command signal CMD and the combination of the internal address signals I_ADDR enable the semiconductor memory device 300 to enter the signature fuse read mode that is a test mode or to perform the normal write operation. During the normal write operation, the input data DIN is written to memory cells of the memory cell array 360.

The memory cell array 360 includes a plurality of memory cells. The row decoder 370 decodes a row address signal I_R_ADDR among the internal address signals I_ADDR which are used to select signature fuses of the fuse boxes 321, 322, ..., 32n, and selects the memory cells connected to one another via a word line (not shown). The column decoder 340 decodes a column address signal I_C_ADDR among the internal address signals I_ADDR which are used to select signature fuses of the fuse boxes 321, 322, ..., 32n, and generates a column selection line activation signal CSL. Here, the column selection line activation signal CSL activates column selection lines (not shown) connected with one another via the bit-line sense amplifier 350 that amplifies bit lines (not shown) connected to the respective memory cells.

A method of writing the signature fuse data SIG_DAT to the memory cells of the memory cell array 360 and reading it back from the memory cells will now be described. First, when the normal write operation begins, the input data DIN at the level "0" is input at the data I/O pin DQ 390, passes through the input buffer 330, and the bit-line sense amplifier 350, and is then written to the memory cells of the memory cell array 360. Next, the semiconductor memory device 300 enters the signature fuse read mode that is a test mode, and the signature fuse data SIG_DAT which is output from the fuse boxes 321, 322, ..., 32n, respectively, passes through the input buffer 330 and the bit-line sense amplifier 350 and is written to the memory cells of the memory cell array 360. After exiting of the signature fuse read mode, during the normal read operation, the signature fuse data SIG_DAT written to the memory cells of the memory cell array 360 is read and output to the data I/O pin DQ 390 via the output buffer 385.

Accordingly, the semiconductor memory device 300 according to another embodiment of the present invention does not require connection of the output buffer 385 to the internal address generator 380 or test-data related circuits, such as the fuse box selection circuit 310 and the fuse boxes 321, 322, ..., 32n, which output the signature fuse data SIG_DAT. Thus, the load applied to the output buffer 385 does not increase, and therefore, the speed of reading data from the output buffer 385 does not decrease during the normal read operation.

Figure 7:
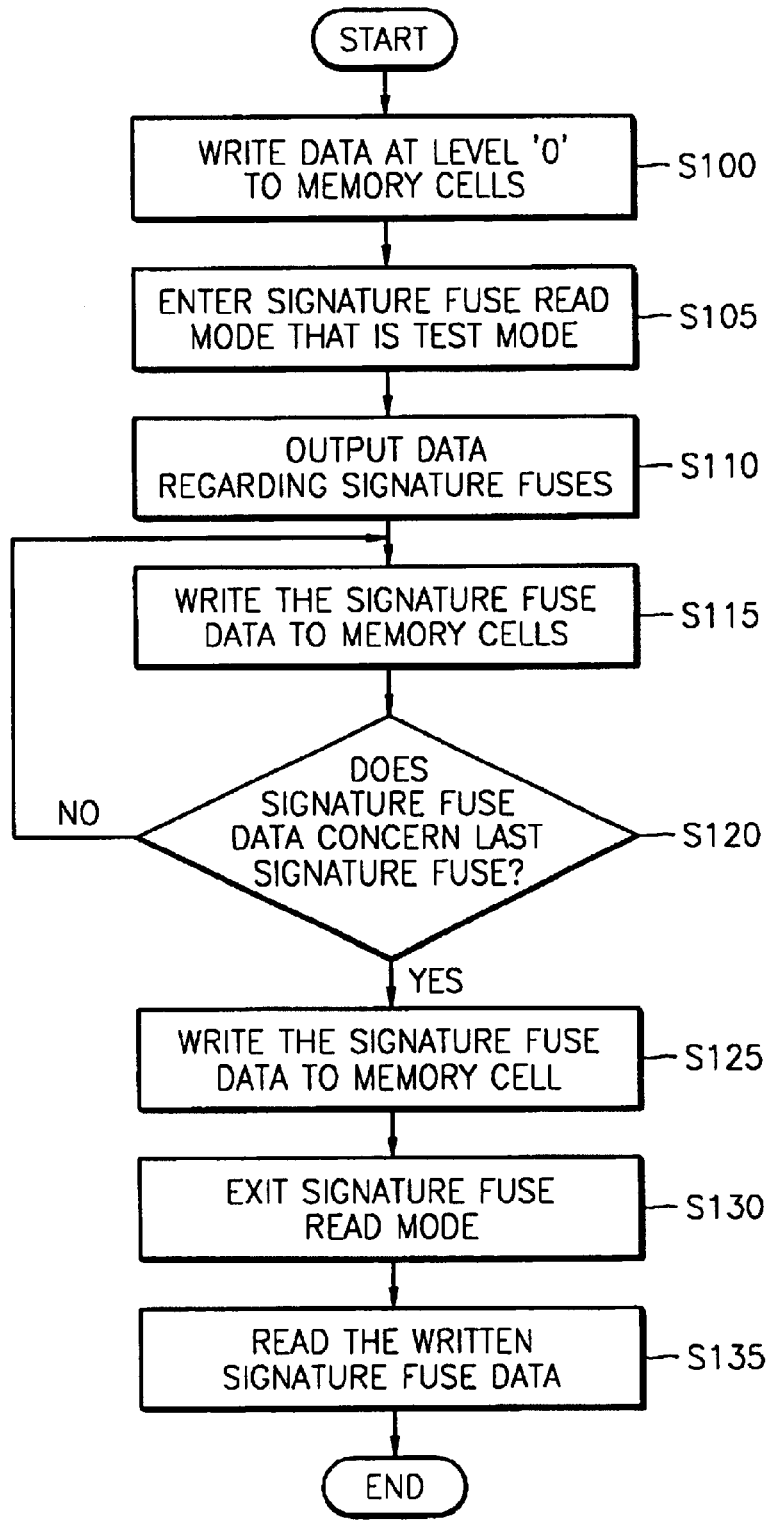
FIG. 7 is a flowchart illustrating a method of reading data regarding signature fuses in a semiconductor memory device through a normal read operation, according to a preferred embodiment of the present invention.

FIG. 7 is a flowchart illustrating a method of reading data stored in signature fuses in a semiconductor memory device during a normal read operation, according to a preferred embodiment of the present invention.

Referring to FIG. 7, in step 100, data at a level "0" is written to memory cells during the normal write operation, thereby initializing data of the memory cells.

In step 105, the semiconductor memory device enters the signature fuse read mode, which is a test mode, in response to a command signal which is synchronized with a clock signal and a combination of address signals. Alternatively, the semiconductor memory device may enter the direct access (DA) mode before entering the signature fuse read mode. Here, the address signal is applied from a source that is external to the semiconductor memory device.

In step 110, data regarding signature fuses is output from fuse boxes selected in response to the address signal. The signature fuse data is at a level "1" or a level "0", depending on whether the signature fuses are cut or not.

In step 115, the signature fuse data is written to memory cells selected in response to the address signal that is the same as the address signal used to select the fuse boxes.

In step 120, it is determined whether signature fuse data to be written to a selected memory cell is data regarding a last signature fuse.

If it is determined in step 120 that the signature fuse data concerns the last signature fuse, the method proceeds to step 125. In step 125, the last signature data is written to the memory cell selected in response to the address signal that is the same as that used to select the fuse boxes.

However, if is it determined in step 120 that the signature fuse data does not concern the last signature, the method returns to step 115 and the signature fuse data is written to the memory cell selected in response to the address signal that is the same as that used to selected the fuse box.

In step 130, the signature fuse read mode ends in response to a command signal that is synchronized with a clock signal and a combination of address signals.

In step 135, the signature fuse data written to the memory cells is read from the memory cells through the normal read operation.

Figure 8:
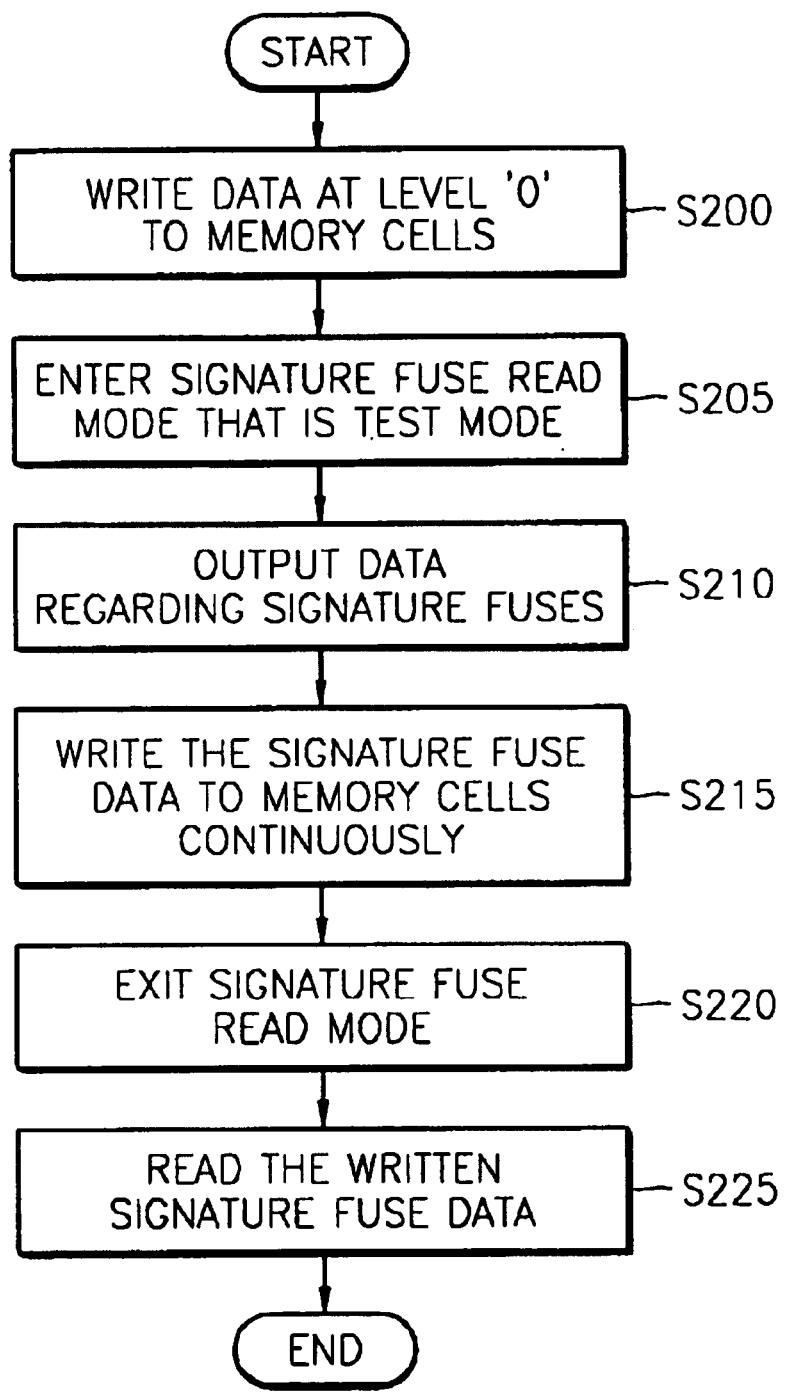
FIG. 8 is a flowchart illustrating a method of reading data regarding signature fuses in a semiconductor memory device through a normal read operation, according to another embodiment of the present invention.

FIG. 8 is a flowchart illustrating a method of reading data related to signature fuses in a semiconductor memory device through a normal read operation, according to a preferred embodiment of the present invention.

Referring to FIG. 8, in step 200, data at a level "0" is written to memory cells through the normal write operation, thereby initializing data originally stored in the memory cells.

In step 205, the semiconductor memory device enters the signature fuse read mode that is a test mode in response to a command signal that is in phase with a clock signal and a combination of address signals. Alternatively, the semiconductor memory device may enter the DA mode before entering the signature fuse read mode. Here, the address signal is an internal address signal that is automatically generated in an internal address generator of the semiconductor memory device.

In step 210, data regarding the signature fuses is output from fuse boxes selected in response to the internal address signal. Each signature fuse data is at a level "0" or a level "1" depending on whether the signature fuse is cut or not.

In step 215, the data regarding the signature fuses are continuously written to memory cells selected in response to the internal address signal that is the same as that used to select the fuse boxes.

In step 220, the semiconductor memory device exits the signature fuse read mode in response to a command signal that is in phase with a clock signal and a combination of internal address signals.

In step 225, the signature fuse data written to the memory cells is read from the memory cells through the normal read operation.

While this invention has been particularly shown and described with reference to preferred embodiments thereof, it will be understood by those skilled in the art that various changes in form and details may be made herein without departing from the spirit and scope of the invention as defined by the appended claims.

What is claimed is:

1. A semiconductor memory device including a plurality of memory cells, the semiconductor memory device comprising:

an input buffer that respectively writes signature fuse data related to signature fuses to the memory cells when the semiconductor memory device enters a test mode; and an output buffer that reads the signature fuse data from the memory cells during a normal read operation of the semiconductor memory device, wherein the signature fuse data comprises binary data that is determined based on whether the respective signature fuse is cut.

2. The semiconductor memory device of claim 1, wherein the input buffer writes one of the signature fuse data and input data, which is generated during a normal write operation of the semiconductor memory device, to the respective memory cells in response to a command signal which is synchronized with a clock signal and a combination of address signals.

3. The semiconductor memory device of claim 2, wherein the input data is initialization data at a low level "0" that is written to the memory cells prior to writing of the signature fuse data to the respective memory cells.

4. The semiconductor memory device of claim 3, wherein the semiconductor memory device further comprises:

a fuse box selection circuit that decodes the command signal which is synchronized with the clock signal and the combination of the address signals and generates a plurality of selection signals; and a plurality of fuse boxes including the signature fuses that output the signature fuse data in response to the selection signals, respectively.

5. The semiconductor memory device of claim 4, wherein the address signal for selecting the respective fuse boxes is the same as the address signal for selecting the respective memory cells to which the signature fuse data is written.

6. The semiconductor memory device of claim 5, wherein the command signal that is in phase with the clock signal and a combination of the address signals enable the semiconductor memory device to enter or exit a signature fuse read mode that is the test mode.

7. The semiconductor memory device of claim 6, wherein the address signal is one of an externally generated address signal and an internal address signal generated in an internal address generator of the semiconductor memory device.

8. A method of reading data regarding signature fuses in a semiconductor memory device, the method comprising:

(a) entering a signature fuse read mode in response to a command signal that is in phase with the clock signal and a combination of address signals;

(b) outputting signature fuse data related to signature fuses included in fuse boxes selected in response to the address signal;

(c) writing the output signature fuse data to memory cells selected in response to the address signal that is the same as the address signal used in (b);

(d) exiting the signature fuse read mode in response to a command signal that is in phase with a clock signal and the combination of address signals; and (e) reading the signature fuse data from the memory cells through a normal read operation of the semiconductor memory device.

9. The method of claim 8, wherein (a) comprises initializing the memory cells by writing data at a low level "0" to the memory cells through a normal write operation.

10. The method of claim 9, wherein (c) further comprises determining whether data related to a signature fuse to be written to a corresponding memory cell concerns a last signature fuse, and continuing to write data regarding the signature fuses to the corresponding memory cells until the signature fuse data of the last signature fuse is written to the memory cells.

11. A method of reading data regarding signature fuses in a semiconductor memory device, the method comprising:

(a) entering a signature fuse read mode in response to a command signal that is in phase with a clock signal and a combination of internal address signals;

(b) outputting signature fuse data related to signature fuses that are included in respective fuse boxes selected in response to the internal address signal;

(c) writing the output signature fuse data to memory cells selected in response to the internal address signal that is the same as the internal address signal used in (b);

(d) exiting the signature fuse read mode in response to a command signal that is in phase with a clock signal and a combination of address signals; and (e) reading the written signature fuse data from the memory cells through a normal read operation of the semiconductor memory device.

12. The method of claim 10, wherein (a) further comprises initializing the memory cells by writing data at a low level "0" to the memory cells through a normal write operation of the semiconductor memory device.

* * * * *